United States Patent [19]

Haight et al.

[11] Patent Number: 4,799,030
[45] Date of Patent: Jan. 17, 1989

[54] VOLTAGE CONTROLLED OSCILLATOR CLAMP CIRCUIT

[75] Inventors: Michael H. Haight, Plano; William H. Giolma, Dallas, both of Tex.

[73] Assignee: Texas Instruments Incorporated, Dallas, Tex.

[21] Appl. No.: 49,187

[22] Filed: May 12, 1987

[51] Int. Cl.⁴ .............................................. H03B 5/08
[52] U.S. Cl. .................................. 331/117 R; 331/167
[58] Field of Search .............. 331/117 R, 117 FE, 167

[56] References Cited

U.S. PATENT DOCUMENTS 4,716,383 12/1987 Lofgren et al. .............. 331/117 FE Primary Examiner—Eugene R. LaRoche
Assistant Examiner—Robert J. Pascal
Attorney, Agent, or Firm—Richard G. Coalter; Leo N. Heiting; Melvin Sharp

[57] ABSTRACT

An oscillator circuit having a coil and capacitor tank circuit, a clamp resistor connected at one end to the coil and a switch coupled to the clamp resistor and coil. The switch is operative to close in response to a first input logic clamp signal and shunt the coil with an impedance that causes the oscillation to stop quickly. In response to removal of the input logic clamp signal the tank circuit starts to oscillate from a known state. Preferably the clamp resistor has a value which equalizes the tank currents for the clamped and peak unclamped states.

12 Claims, 1 Drawing Sheet

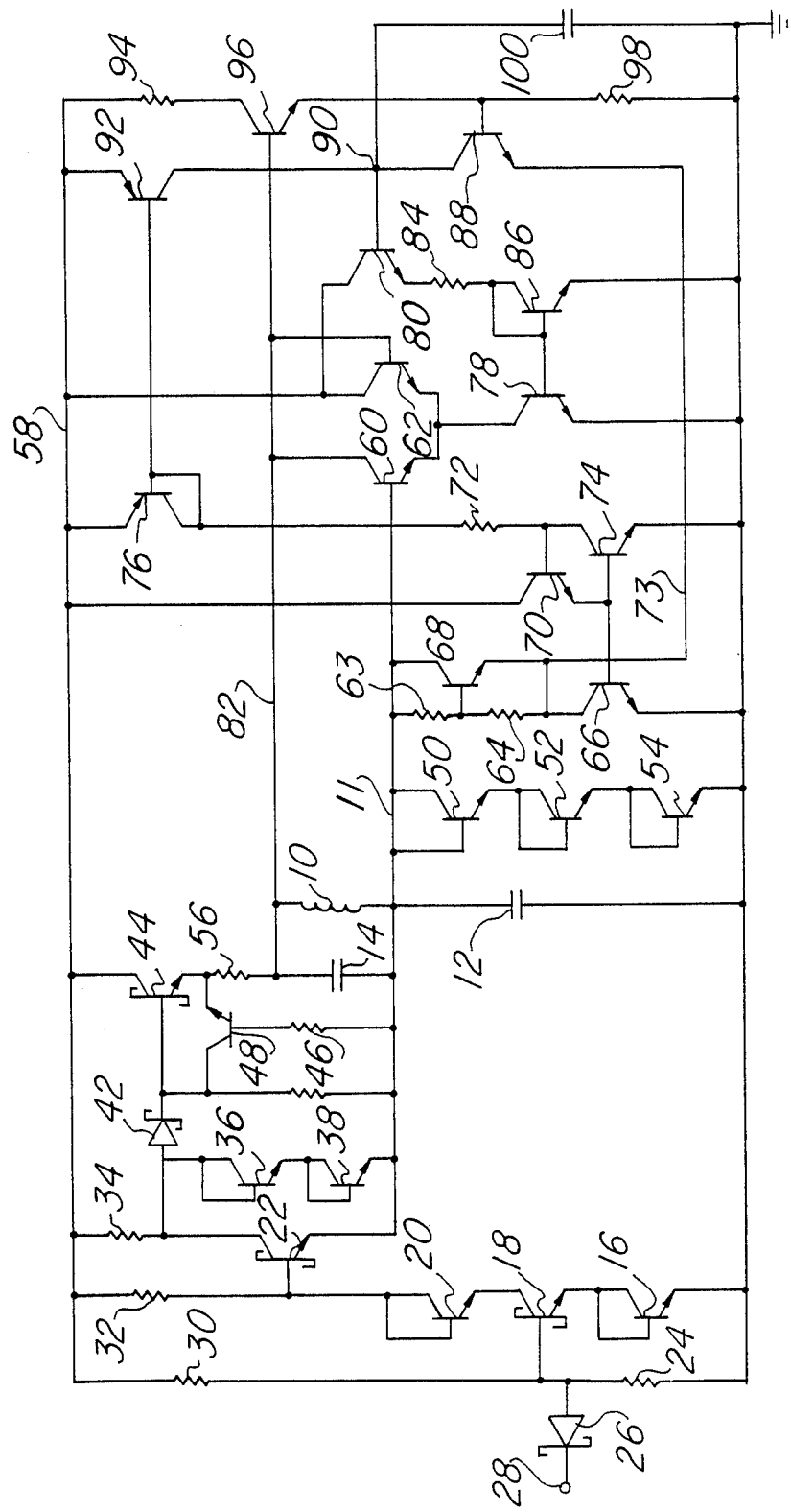

VOLTAGE CONTROLLED OSCILLATOR CLAMP CIRCUIT

BACKGROUND

The present invention relates to a clamp for a tank circuit of a voltage controlled oscillator which places the tank circuit in a known state on start up and also controls the stopping of the oscillation.

In applications where a voltage controlled multivibrator is not feasible the usual alternative is to use a tank type voltage controlled oscillator having a coil and capacitor. On the one hand the relatively large electrical inertia of the coil and capacitor (LC) makes an LC tank circuit less susceptable to noise on its frequency generating input(s), which almost always have to be externally connected. On the other hand where it is important to be able to stop the oscillator and then start it from a known state, the large inertia of the LC circuit makes the latter difficult.

SUMMARY OF THE INVENTION

According to a preferred embodiment of the invention there is provided an oscillator circuit having a coil and capacitor tank circuit, a clamp resistor connected to an alternating voltage end of the coil and a switch coupled to the clamp resistor and coil and operative in response to a first input logic clamp signal level to shunt a predetermined impedance across the coil and pass a predetermined current through the coil and, in response to a second input logic clamp signal level, to open and permit the tank circuit to commence oscillating from a known state.

Preferably the clamp resistor has a value which shunts the tank impedance to stop oscillation quickly and equalizes the tank currents for the clamped and the peak unclamped states.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

The sole FIGURE is a circuit diagram of a voltage controlled oscillator having a tank oscillator circuit and a clamping arrangement for clamping the tank circuit so that it can restart from a known state.

DETAILED DESCRIPTION WITH REFERENCE TO THE DRAWINGS

Referring to the FIGURE there is shown a voltage controlled oscillator having a coil 10 and a voltage variable capacitor 14. An additional capacitor 12 couples a bias line 11 to ground. A logic clamp input line 28 couples through a Schottky diode 26 to the base of a Schottky transistor 18. Resistor 30 biases transistor 18 on. Resistor 24 aids in turning transistor 18 off by channeling base charge to ground.

Transistor 16 couples the emitter of transistor 18 to ground and adds one base-emitter voltage to the input logic threshold on line 28. Transistor 20 coupled to the collector of transistor 18 is diode connected as is transistor 16 and adds an emitter-base voltage between the base of Schottky transistor 22 and the collector of transistor 18. Resistor 32 provides bias current for the base of transistor 22 and collector current for transistor 18.

Schottky transistor 22 has its emitter coupled through diode connected transistors 50, 52 and 54 to ground thereby setting the bias voltage on line 11 to three emitter-base voltages above ground. The collector of transistor 22 drives a load resistor 34 and also couples to the base of NPN transistor 44 through Schottky diode 42. A pair of diode connected transistors 36 and 38 couple the collector of transistor 22 to its emitter. The collector of transistor 44 connects to high voltage line 58 while its emitter connects to coil 10 through a clamp resistor 56. The emitter of transistor 48 connects to the emitter of transistor 44 while its collector connects to the base of transistor 44. The base of transistor 48 is coupled to line 11 through resistor 46. The collector of transistor 60 of a differential pair current current steering circuit consisting of transistors 60 and 62 is coupled to an alternating current end of coil 10 and to the base of transistor 62. The base of transistor 60 connects to line 11 while the emitters of transistors 60 and 62 connect through the collector of NPN transistor 78 to ground. The alternating voltage end of coil 10 couples to line 82 which connects to the collector of transistor 60, to the base of transistor 62 and to the base of transistor 96. Transistors 66 and 74 form a current mirror with the size of transistor 66 being 5 times that of transistor 74. Thus, for a given current through transistor 74 there will be about 5 times that current through transistor 66. Other size ratios of transistor 66 to transistor 74 could be used.

Base drive to transistors 66 and 74 is provided by the emitter of transistor 70. The base of transistor 70 is connected to the collector of transistor 74. The voltage drop across the collector to emitter of diode connected transistor 76 plus the voltage drop across resistor 72 and the base to emitter voltage of transistor 74 determines the emitter to base voltage of transistor 70 and hence the current drawn by the latter. Thus, resistor 72 sets the current through transistor 74 and the size ratio of transistors 66 and 74 determine the current through transistor 66.

The value of resistors 63 and 64 and the base to emitter voltage of transistor 68 determines the voltage of the emitter of transistor 68 (and 88). The voltage of the emitter of transistor 68 on line 73 is equal to the following:

$$V_{73} = V_{11} - (1 + R_{63}/R_{64})V_{be}$$

where $V_{be}$ is the emitter to base voltage of transistor 68. The pair of PNP transistors 76 and 92 also form a current mirror in which the current through transistor 92 equals that through transistor 76 because of their equal sizes. Both of the emitters of transistors 76 and 92 are connected to a positive voltage supply line 58. The collector of transistor 92 is connected to AGC node 90 to which an AGC capacitor 100 is also coupled. Current mirror comprising transistors 76 and 92 apply approximately 200 microamperes full time to the AGC capacitor 100 coupled to node 90 as set primarily by resistor 72. The collector of transistor 88 connects to AGC node 90 and its emitter to line 73. Current through resistor 98 determines the base to emitter voltage of transistor 96. Transistor 96 presents a voltage to the base of transistor 88 equal to the line 82 voltage minus the transistor 96 emitter to base voltage. Current in transistor 88 flows only when the base voltage exceeds the voltage sent on line 73 by a sufficient amount. When transistor 88 conducts, its collector current removes charge from capacitor 100 and thereby reduces the voltage on line 90.

Differential NPN transistors 60 and 62 have their emitters connected to the collector of transistor 78. The collector of transistor 62 connects to Vcc line 58 and to the collector of transistor 80. The collector of transistor 60 connects to tank line 82. The emitter of transistor 80 connects to one end of resistor 84, the other end of which couples to diode connected transistor 86. As the voltage across the tank oscillates, current through transistor 62 increases during the positive half cycles and decreases during the negative half cycles. In order to keep the current through transistor 78 constant as determined by the voltage on node 90 and the resistance of resistor 84, transistor 60 conducts current from the tank line 82. The oscillator gain is determined by current in the emitter of transistor 60 and the impedance of the tank circuit.

As the voltage on tank line 82 varies due to tank oscillation, the emitter follower transistor 96 varies the current through resistor 98. The varying voltage across resistor 98, in turn, is applied to the base of transistor 88. Transistor 88 discharges current from AGC node 90 when its base voltage reaches the voltage on line 73 plus an emitter-base forward voltage drop. The voltage at which transistor 88 discharges the AGC node 90 is determined by the voltage on line 73. The higher the voltage of emitter line 73, the shorter the duration of discharge by transistor 88 and the higher the voltage across the AGC capacitor 100 attached to node 90.

Since transistor 80 draws only a small base current from AGC node 90, the discharge of the AGC capacitor 100 is determined almost solely by the ratio of resistors 63 and 64. Thus, there is no dependence on such factors as transistor gain. Moreover, since the only gain dependence is on passive components which can be integrated, stray capacitance can be minimized.

The operation of the tank circuit clamp is designed to stop the oscillation within 6 periods of invoking input logic on clamp line 28 and to start up and free run from a known state when unclamped. With the logic clamp signal on line 28 low, transistor 18 is biased off and transistor 22 is on. Therefore diode connected transistors 36 and 38 are held off by the low collector-emitter saturation voltage of transistor 22. The low voltage on the collector of transistor 22 causes transistor 44 to remain off thereby leaving a high impedance in parallel with the tank circuit consisting of coil 10 and capacitor 14 in series with capacitor 12. Thus, the tank circuit is free to oscillate. As the output voltage from an integrator (not shown) coupled to capacitor 14 varies, the capacitance of variable capacitor 14 changes, thereby changing the frequency of oscillation. An increased voltage on capacitor 14 causes a decreased capacitance of variable capacitor 14 and hence an increased frequency of oscillation.

When the voltage on line 28 is raised above the sum of the emitter base voltages of transistors 16 and 18 less the forward drop across diode 26, then transistor 18 turns on, dropping the base voltage of transistor 22 and turning off the latter. Diode connected transistors 36 and 38 in combination with resistor 34 then set the voltage of the collector of transistor 22 and, with the emitter current of transistor 44, set a current through transistors 50, 52 and 54. The clamped current through the inductor 10 is determined by transistor 44 and resistor 56. Thus, transistor 44 turns on shunting coil 10 with resistor 56 and driving current through resistor 56 and coil 10. Resistor 56 is external to the integrated circuit on which the clamp circuit and associated other circuitry is located and is valued so that the inductor current is the same for the clamped and peak unclamped states. With the inductor current so set, upon shutting off the inductor current the oscillation restarts from a peak position in the oscillation corresponding to the peak magnitude of the inductor current.

The function of transistor 48 is to turn on if the emitter of transistor 44 should inadvertently be grounded and thereby shut off transistor 44.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An oscillator circuit having a tank coil and capacitor, comprising:
   a clamping resistor coupled to an alternating voltage end of said tank;
   a clamp switch coupled between said clamping resistor and a source of high voltage operative in response to a first logic clamp input signal to close and shunt said coil with said clamping resistor so as to stop the oscillation and, in response to removal of said logic clamp signal, to open and permit oscillation to resume, wherein the coil current established when said clamp switch is closed is approximately equal to the peak tank current for the unclamped state, and wherein said clamp switch includes a transistor having an emitter connected to an alternating voltage end of said clamping resistor, means for biasing a d. c. end of said coil at a selected substantially fixed voltage above ground, means for biasing a base of said transistor at a selected voltage above said d. c. end of said coil in response to the logic clamp input signal.

2. A circuit according to claim 1, including a means for turning off said clamp switch transistor in response to an a. c. end of said coil being coupled to ground through a low impedance to a. c. current.

3. A circuit according to claim 1, wherein said d. c. biasing means includes a plurality of diode connected transistors connected in series between a d. c. end of said coil and ground.

4. A circuit according to claim 1, wherein said base biasing means includes a plurality of diode connected transistors connected between between a driving node and said d. c. end of said coil, a resistor from a high voltage source connected to said driving node and a diode connected between said driving node and the base of said switch transistor.

5. A circuit according to claim 4, including a driver transistor having a collector connected to said driving node and an emitter to said d. c. end and a base coupled to means for lowering said base voltage for turning off said driver transistor in response to an input logic clamp signal.

6. A circuit for clamping an oscillator tank circuit so that it restarts from a known state, comprising:

means for biasing a d. c. end of a coil of said tank circuit at a substantially fixed voltage above ground;

current limiting means coupled to an alternating voltage end of said coil;

switch means for shunting the coil with an impedance so as to stop the oscillation within a predetermined number of cycles of oscillation in response to an input clamp logic signal and for removing said shunt impedance upon removal of said input clamp logic signal; and wherein a coil current is established in said coil when said switch means is closed that is approximately equal to the peak tank current for the unclamped state.

7. A circuit according to claim 6, wherein said shunt impedance is a resistor.

8. A circuit for clamping an oscillator tank circuit so that it restarts from a known state, comprising:

means for biasing a D. C. end of a coil of said tank circuit at a substantially fixed voltage above ground;

current limiting means coupled to an alternating voltage end of said coil;

switch means for shunting the coil with an impedance so as to stop the oscillation in response to an input clamp logic signal and for removing said shunt impedance upon removal of said input clamp logic signal; and wherein said switch means includes a transistor having an emitter connected to an A. C. end of said coil via said impedance, means for biasing a D. C. end of said coil at a selected substantially fixed voltage above ground, and means for biasing a base of said transistor at a selected voltage above said D. C. end of said coil in response to said input clamp logic signal.

9. A circuit according to claim 8, including means for turning off said switch transistor in response to an alternating voltage end of said coil being grounded.

10. A circuit according to claim 9, wherein said d. c. biasing means includes a plurality of diode connected transistors connected in series between a d. c. end of said coil and ground.

11. A circuit according to claim 9, wherein said base biasing means includes a plurality of diode connected transistors connected between between a driving node and said d. c. end of said coil, a resistor from a high voltage source connected to said driving node and a diode connected between said driving node and the base of said switch transistor.

12. A circuit according to claim 11, including a driver transistor having a collector connected to said driving node and an emitter connected to said d. c. end, a logic signal amplifier transistor having a collector coupled to a base of said driver transistor through a level shifter, a base coupled to a logic clamp input signal source and an emitter coupled through a level shifting diode to ground.

* * * * *